(12) United States Patent  
Ogle et al.

(10) Patent No.: US 9,007,744 B2  
(45) Date of Patent: Apr. 14, 2015

(54) MEDIA APPLIANCE AND METHOD FOR USE OF SAME

(71) Applicant: Enseo, Inc., Richardson, TX (US)

(72) Inventors: Vanessa Ogle, Richardson, TX (US); Jeff Johns, Murphy, TX (US); Bill Fang, Plano, TX (US)

(73) Assignee: Enseo, Inc., Richardson, TX (US)

( * ) Notice: Subject to any disclaimer, the term of this patent is extended or adjusted under 35 U.S.C. 154(b) by 0 days.

(21) Appl. No.: 14/306,000

(22) Filed: Jun. 16, 2014

(65) Prior Publication Data

US 2014/0293515 A1 Oct. 2, 2014

Related U.S. Application Data

(63) Continuation of application No. 13/185,484, filed on Jul. 18, 2011, now Pat. No. 8,755,174.

(60) Provisional application No. 61/364,997, filed on Jul. 16, 2010.

(51) Int. Cl.

| | |
|---|---|
| *H05K 7/16* | (2006.01) |
| *A47B 81/00* | (2006.01) |
| *H02B 1/42* | (2006.01) |
| *H05K 5/02* | (2006.01) |
| *H05K 7/20* | (2006.01) |
| *H02B 1/56* | (2006.01) |
| *G06F 1/16* | (2006.01) |

(52) U.S. Cl.  
CPC ............... *H02B 1/42* (2013.01); *H05K 5/0278* (2013.01); *H05K 7/20963* (2013.01); *H02B 1/56* (2013.01); *G06F 1/16* (2013.01)

(58) Field of Classification Search  
USPC ............... 361/679.01–679.09, 679.1–679.19, 361/679.21–679.29, 679.31–679.45, 361/679.55–679.6, 724–747, 97.01, 98.01, 361/137, 137 D; 348/14.07, 51–52, 177, 348/333.01–333.13, 739; 369/75.1, 75.2, 369/75.11, 75.21, 76, 77.11, 77.21, 78, 79, 369/80, 81, 82  
See application file for complete search history.

(56) References Cited

U.S. PATENT DOCUMENTS

| | | |
|---|---|---|
| 5,599,206 A | 2/1997 | Slack et al. |
| 5,721,394 A | 2/1998 | Mulks et al. |
| 5,886,732 A | 3/1999 | Humpleman |
| 6,420,964 B1 | 7/2002 | Nishikawa et al. |
| 6,750,398 B1 | 6/2004 | Richardson |

(Continued)

OTHER PUBLICATIONS

"Jack PC—The Future of Computing." Chip PC Technologies. n/d Web. Jul. 19, 2011.

*Primary Examiner* — Jerry Wu  
(74) *Attorney, Agent, or Firm* — Scott T. Griggs; Griggs Bergen LLP

(57) ABSTRACT

A media appliance and method for use of the same are disclosed. In one embodiment, a housing is adapted to be mounted within a wall. A panel forms a front portion of the housing and the panel includes vents and the panel may be mounted substantially flush with the wall. A media player, which includes a set-top box, is disposed within the housing. A pair of ports, disposed within openings defined by the housing, are configured to receive respective optio-electric connectors. Each port includes optio-electrically conductive elements. The pair of ports are coupled to the media player and one port is configured for providing a connection to a television and the other port is configured for providing a connection to an external source of signal for the television.

7 Claims, 2 Drawing Sheets

(56) References Cited

U.S. PATENT DOCUMENTS

| | | |
|---|---|---|
| 6,856,043 B2 | 2/2005 | DeLeeuw |
| 6,943,295 B2 | 9/2005 | Herth |
| 7,612,653 B2 | 11/2009 | Miller et al. |
| 8,755,174 B2 | 6/2014 | Ogle et al. |
| 2006/0098638 A1 | 5/2006 | Binder |
| 2007/0275595 A1 | 11/2007 | Hazani et al. |
| 2008/0205606 A1 | 8/2008 | Binder |
| 2009/0161322 A1* | 6/2009 | Hughes ......................... 361/724 |
| 2010/0226100 A1* | 9/2010 | Johnson et al. ............... 361/730 |
| 2011/0283120 A1 | 11/2011 | Sivertsen |

* cited by examiner

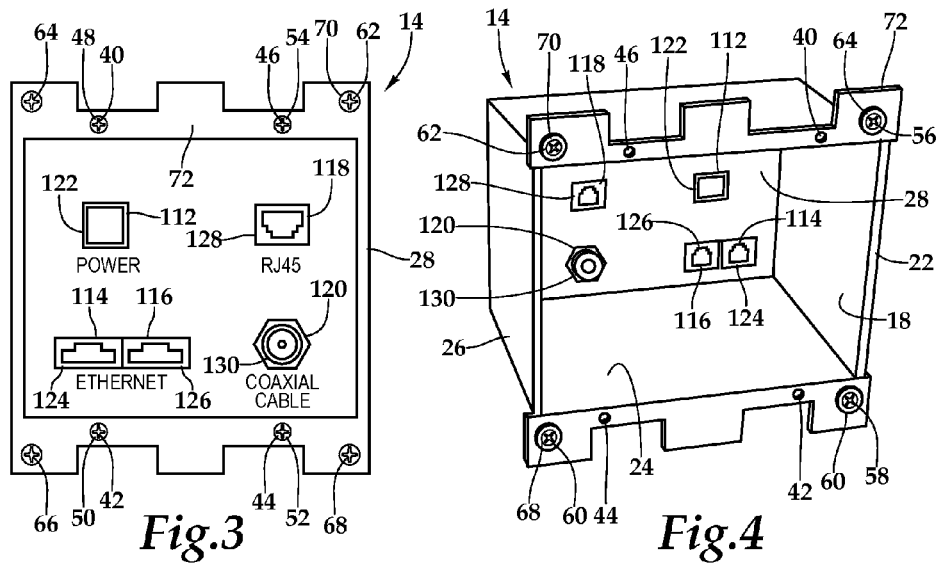
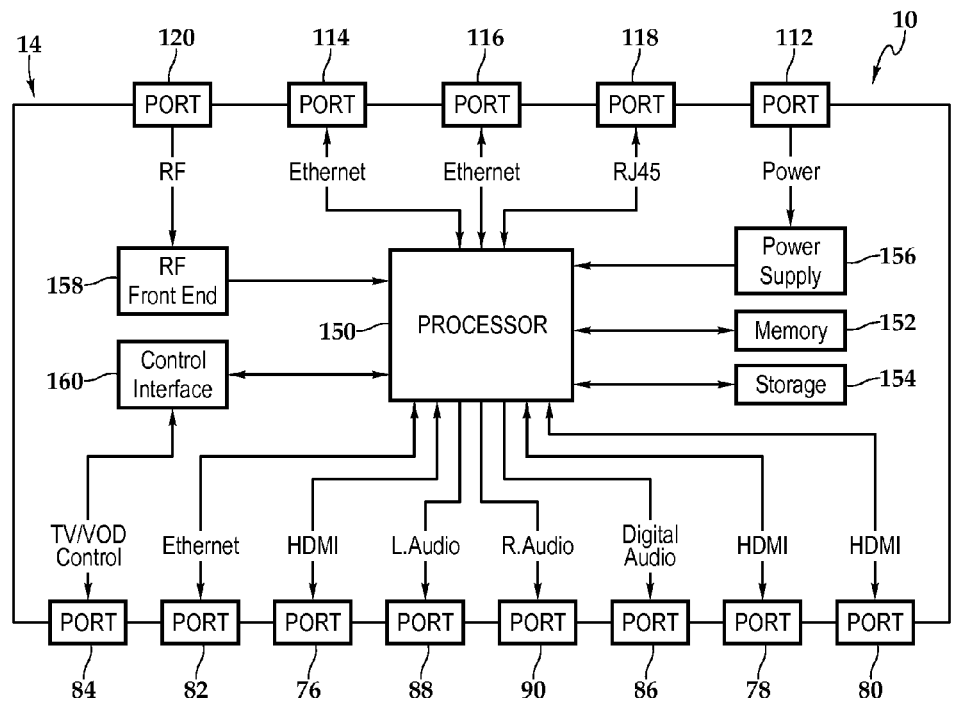

MEDIA APPLIANCE AND METHOD FOR USE OF SAME

PRIORITY STATEMENT & CROSS-REFERENCE TO RELATED APPLICATIONS

This application is a continuation of U.S. patent application Ser. No. 13/185,484 entitled "Media Appliance and Method for Use of Same" filed on Jul. 18, 2011 in the names of Vanessa Ogle et al. and issued on Jun. 17, 2014 as U.S. Pat. No. 8,755,174; which claims priority from U.S. Patent Application No. 61/364,997 entitled "Media Appliance and Method for Use of Same" and filed on Jul. 16, 2010, in the names of Vanessa Ogle et al.; which are hereby incorporated by reference for all purposes.

TECHNICAL FIELD OF THE INVENTION

This invention relates, in general, to media players and, in particular, to media appliances and consumer electronics devices that are capable of storing and playing digital media in a confined form factor.

BACKGROUND OF THE INVENTION

The traditional form factors for media players such as set top boxes and audio systems, dictate sleek and stylish rectangular shaped units that are able to be placed on cabinet shelves or inside of entertainment cabinets. With today's flat screen televisions designed for wall mount, entertainment cabinets are no longer required for the TV set. This, in turn, raises issues regarding the placement of traditional media players.

SUMMARY OF THE INVENTION

It would be advantageous to achieve media appliances and consumer electronics devices that are capable of storing and playing digital media in a confined form factor. It would also be desirable to enable an electro-mechanical solution that would provide a preferential placement for a traditional media player, while recognizing the wall mount-based placement of today's flat screen televisions. To better address one or more of these concerns, a media appliance and method for use of the same are disclosed that are capable of storing and playing digital media as well as providing set top box functionality. In one embodiment, a media appliance includes a housing adapted to be mounted within a wall. A panel, including vents, forms a front portion of the housing to substantially mount flush with the wall. Mounting holes are located in the panel to accept screws to secure the housing within the wall. A media player having a set-top box functionality is disposed within the housing. Ports provide optio-electrical (e.g., electrical, optical or both) connectors for connecting a television to an external source of signal for the television.

The media appliance provides a media infrastructure that can be built as part of a house, hotel or a commercial building, for example, to furnish broadband and local connectivity, processing of the media streams and presenting the sound and picture ready to be viewed and listened from any television set. The traditional form factors for media players such as set top boxes, audio systems, and media players are designed with stylish rectangular shaped units to be place on cabinet shelves or inside of entertainment cabinets. With today's flat screen televisions designed for wall mount, entertainment cabinets are no longer required for the television set.

In one implementation, the media appliance is integrated into wall mount J boxes for an in wall solution. The media appliances or devices can be built in the wall and behind the wall mount flat panel television. This concept may further enhance the appearance of wall mount style televisions and have no visible external devices and wires. The media appliance may include various built-in media players, such as IP set-top boxes, cable set top boxes, streaming audio players, automation controllers, and Internet gateways, for example. These and other aspects of the invention will be apparent from and elucidated with reference to the embodiment(s) described hereinafter.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 3 is a rear elevation view of the media appliance presented in FIG. 1;

FIG. 4 is a front perspective view of a housing associated with the media appliance presented in FIG. 1; and FIG. 5 is schematic representation of one embodiment of the media appliance.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the present invention.

Figure 1:
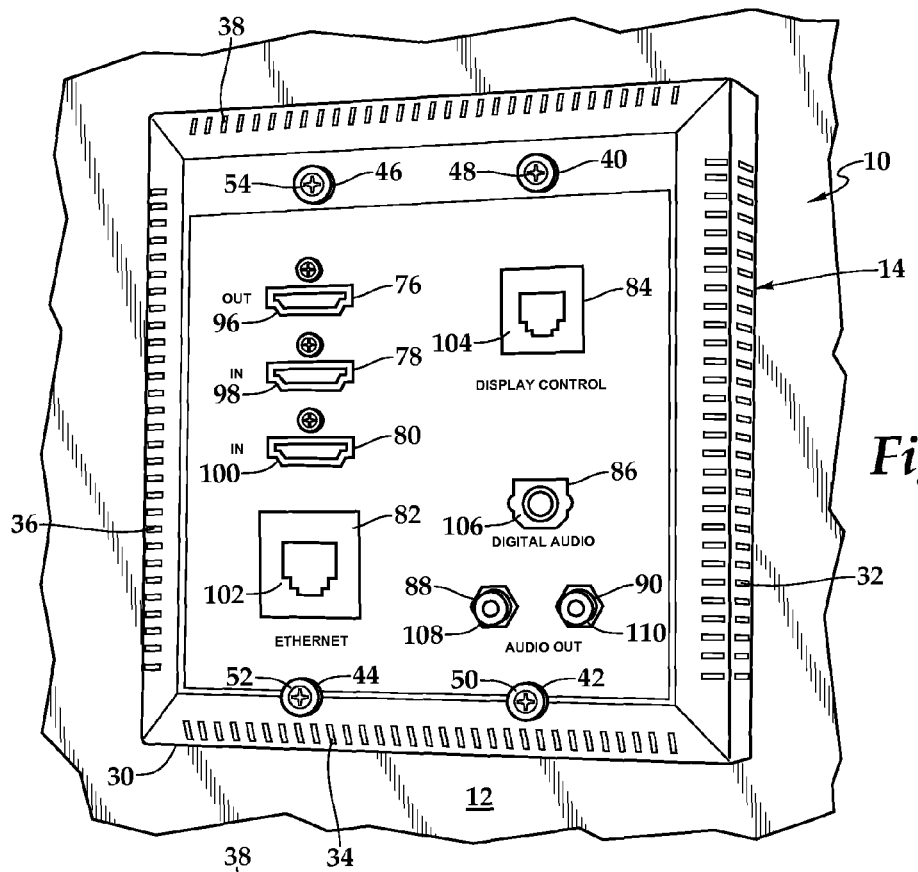
FIG. 1 is a front elevation view of one embodiment of the media appliance presented herein mounted to a wall.
Figure 2:
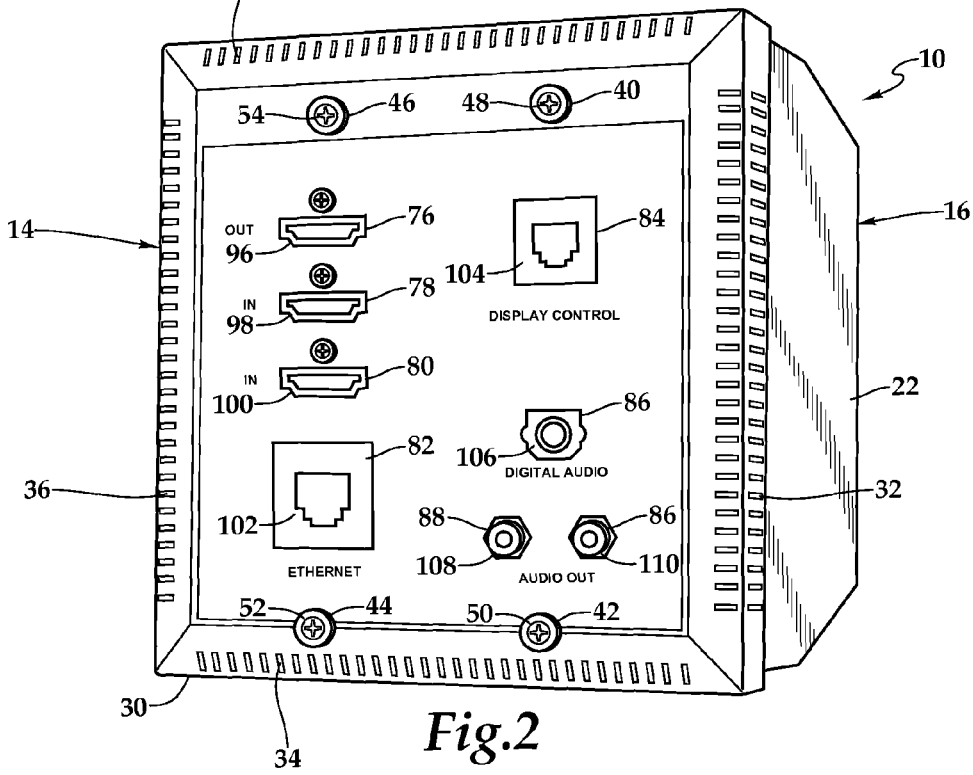
FIG. 2 is a front perspective view of the media appliance presented in FIG. 1.

Referring to FIGS. 1 through 4, therein is depicted a media appliance that is illustrated and generally designated 10. The media appliance 10 is mounted within a wall 12 and includes a housing 14, which, as shown, is a utility box 16 having an open end 18 and four side walls 20, 22, 24, 26 as well as a rear wall 28, which is opposite the open end 18. A panel 30, which is configured to substantially mount flush with the wall 12, mates with the open end 18 of the utility box 16 to form a front portion of the housing 14. As shown, the panel 30 includes vents and, in particular, vents 32, 34, 36, 38. Although, it should be appreciated that any configuration of vents may be utilized.

A plurality of mounting holes are located in the panel 30 to accept fasteners, such as screws, which are driven into corresponding mounting holes at an edge of the open end 18 of the utility box 16. In the illustrated embodiment, four mounting holes 40, 42, 44, 46 and four respective screws 48, 50, 52, 54 are employed to secure the panel 30. Similarly, the utility box 16 may include wall mounting holes and corresponding fasteners and brackets for securing the media appliance 10 within the wall 12. As shown, the utility box 16 includes fasteners 56, 58, 60, 62 for mating with mounting holes 64, 66, 68, 70 at flange 72 which extends from the open end 18 of the utility box 16.

Ports, disposed within respective openings defined by the housing, receive respective optio-electric connectors, which may be optical or electrical, for example, that include optio-electrically conductive elements. The ports are configured to provide a connection to external audio-visual devices, such as televisions, and external sources of signal for the external audio-visual devices, such as coaxial cable, fiber, ethernet, USB devices, etc. By way of example and not by way of limitation, the ports and associated optio-electric connectors may include RJ45, serial, IR Input, service/control, USB, video, ethernet, L/R audio cable, and digital audio optical. As shown, in one implementation, the panel 30 includes openings 76, 78, 80, 82, 84, 86, 88 for corresponding ports 96, 98, 100, 102, 104, 106, 108, 110, which further correspond to the respective following optio-electric connectors: video output (HDMI-HDCP), video input (HDMI-HDCP), video input (HDMI-HDCP), ethernet, display control (ethernet), digital audio, left audio output, and right audio output. With respect to the rear wall 28, openings 112, 114, 116, 118, 120 for corresponding ports 122, 124, 126, 128, 130 which further correspond to the respective following optio-electric connectors: power, ethernet, ethernet, RJ45, and coaxial cable. It should be appreciated that although one architecture of openings, ports, and optio-electric connectors is depicted, the location and types of openings, ports, and optio-electric connectors may vary with the teachings presented herein and FIGS. 1-4 present only a non-limiting example. As described, each port includes a plurality of optio-electrically conductive elements for coupling to the circuit board. The optio-electrically conductive elements couple an external source of signal to the circuit board and processor 150 or couple an external audio-visual device, such as a television or music player, to the processor 150. As depicted, all output sources are located on the panel 30 and input sources are located on the panel 30 and in the utility box 16, whether a side wall 20, 22, 24, 26 or a rear wall 28, as shown.

Referring to FIG. 5, one embodiment of a media appliance 10, which includes set-top box functionality and/or media player functionality, is depicted. As shown, the media set-top/back box and media player functionalities are embodied on a processor 150 and memory 152 having processor-executable instructions stored thereon, for example. The set-top box functionality provides for turning a received signal into content which is then displayed on the television screen or other display device, as well as hotel gateway and menu services and video-on-demand, for example. The media player functionality may represent any type of consumer electronics device that is capable of storing and playing digital media or permitting digital media to pass therethrough.

In one implementation, storage 154 provides local audio and video files to the processor 150 or other hardware/software/firmware configuration. The media appliance 10 operates under the power of a power supply 156, which may convert the wall power provided by a source via port 122 to an acceptable voltage for powering circuitry. Alternatively, power over ethernet via port 124, 126 may be utilized eliminating the need for port 122. Port 128 provides an input signal to the media player and the media engine by way of an RF front end circuit portion 158, which may, for example, processes signals from coaxial cable. As mentioned, ports 124, 126 provide the ethernet interface to the media engine. As shown, all ports 122, 124, 126, 128, 130 are coupled to the processor, which may more generally be a circuit board.

A control interface 160 between the processor 150 and the television, for example, utilizes port 106 to provide control and interface with VOD systems, if required. It should be appreciated that VOD may require an additional or separate port in some instances. As discussed previously, ports 96, 98, 100, 102, 104, 108, 110, which further correspond to the respective following optio-electric connectors: video output (HDMI-HDCP), video input (HDMI-HDCP), video input (HDMI-HDCP), ethernet, digital audio, left audio output, and right audio output. Although there are no LEDs for user indicators, as the in-wall unit will not be visible to the user in many instances, in implementations where a portion of the in-wall unit is visible or for another reason, LED indicators may be provided. Further a transceiver may be provided for wireless communication with the media appliance 10. With the in-wall configuration, control of the media appliance 10 may be achieved through the television and a graphical user interface and/or television remote controller. It should further be appreciated, that although one particular architecture is depicted in FIG. 5, other architectures are within the teachings presented herein.

In operation, the media appliance therefore accommodates electrical wiring for television and media systems that require numerous cables to connected between the media appliance (Cable STB, Satellite STB, game console, IP streaming player, computer, DVD, Blueray, etc) and display device, such as television. In the current environment, set-top boxes cannot set on top of the display device, and if the display is wall mounted, a significant number of cables are routed to the back of the display, either with construction costs for hiding cables, or with the cables visible. The media appliance may be located in the same room, or in a different location in a dwelling. In these environments, the construction provides only cosmetic treatment of a traditional cable solution between two devices.

A system and method are provided for the media appliance to be located behind the display device, and incorporated into the infrastructure of the facility. The media appliance incorporates in-wall components that provide the media generation, or receiving bridge from other broadcasting/transmitting devices to the in-wall media appliance or device. Moreover the media appliance provides user accessible inputs and outputs for connection to the display device or other media sources connecting into the media appliance. In addition, the in-wall media appliance can provide integrated display control that allows the infrastructure approach to connect and control the display device in a single integrated solution.

As shown, the wall appliance is designed to be hidden from the user. These units will utilize the television screen for the user to control and navigate the player's function. A tight integration with the television set is required so that the users can seamlessly move from watching TV, selecting set top sources, listening to music, controlling various automation and securities, and, browsing the internet through the set top box. The interfaces on these in wall media appliances may include a control interface, an audio interface and a video interface.

The media appliance to TV control interface can be CEC or a simple serial link such as RS232/422. HDMI is the preferred interface for audio and video. Analog video and audio interface can also be provided for ease of integration with the TVs. In one embodiment, the solution outlined is conceived as a utility to address the convergence of media (video, audio, graphical data, control) and develop an integrated infrastructure approach to bridge these media types of a display device in a near-zero footprint device. It incorporates the integration of various media appliances including the set-top box in a thin in-wall appliance. In both households and commercial environments, displays (TVs, Computer Monitors, other visual display devices) have been linked to external devices and appliances (Set-Top-Box, PC, Notebook, DVD player, Blu-Ray player, Internet devices) to generate video signals for content and connected media. These external devices require cabling for power, audio, video, coax, ethernet and control to provide the necessary value to the connected display device. The resulting effect is a situation whereby the display device is becoming thinner and potentially wall mounted, yet the connected device is located in a different location with cabling in between.

The media appliance provides a media infrastructure device that provides the connectivity, processing and fully operational connected media device, in an in-wall or flush-mount solution. The product can be mounted behind the wall-mounted display device, or as an infrastructure panel near the display device, resulting in a zero or near zero footprint device.

The media appliance or device may serve as an end-point media receiver from other devices connected, or as the complete stand-alone device providing the media and content for the display device. Related applications include in-wall media player, cable or satellite set-top-box Ethernet and other media cable connected media device at point of distribution, device for monitors or displays for computing, digital signage or information signage. Thin, wall mounted displays or televisions for low profile mounting. In-wall connectivity panel for user connected devices may include an in-wall casement, media player or other media generating device, video output connectors, receiving unit for control (IR, RF, Bluetooth or other wireless control method), power source, display control, cable, satellite, or IP set-top box, streaming audio player, data and Internet connectors, and cover.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A media appliance comprising: a housing adapted to be mounted within a wall, the housing including a utility box and a panel configured to mount thereto; the panel forming a front portion of the housing, the panel including vents, the panel configured to substantially mount flush with the wall; a plurality of mounting holes located in the panel, the plurality of mounting holes configured to accept fasteners; mounting brackets for securing the utility box to the wall; a media player disposed within the housing, the media player including a set-top box functionality; the set-top box functionality configured to process audio-visual signals from external audio-visual sources at second and fourth ports and the set-top box functionality to provide audio-visual signals to external audio-visual devices at first and third ports;

the first, and second, third and fourth ports, disposed within respective first and second openings defined by the housing, for receiving respective optio-electric connectors, each port including a plurality of optio-electrically conductive elements, the first, and second, third and fourth ports being coupled to the media player; the first port and third ports configured for providing a connection to a television; the first and third ports being located in the utility box; the second port and fourth ports configured for providing a connection to an external source of signal for the television; the second and fourth ports being located in the panel; a power port disposed within a third fifth opening defined by the housing in the utility box, the power port for receiving electrical power at the media player.

2. The media appliance as recited in claim 1, wherein the optio-electric connectors are selected from the group consisting of RJ45, serial, IR Input, service/control, USB, video, ethernet, L/R audio cable, and digital audio optical.

3. The media appliance as recited in claim 1, further comprising a power indicator mounted in the panel and located in communication with the media player.

4. A media appliance comprising: a housing adapted to be mounted within a wall, the housing including a utility box and a panel configured to mount thereto; the panel forming a front portion of the housing, the panel including vents, the panel configured to substantially mount flush with the wall; fasteners configured to secure the panel to the utility box; mounting brackets for securing the utility box to the wall; a circuit board secured within the housing, the circuit board including a processor and a memory accessible to the processor, the memory including processor-executable instructions that, when executed, cause the processor to execute set-top box functionality; the set-top box functionality configured to process audio-visual signals from external audio-visual sources at second and fourth ports and the set-top box functionality to provide audio-visual signals to external audio-visual devices at first and third ports;

the first, and second, third and fourth ports, disposed within respective first and second openings defined by the housing, for receiving respective optio-electric connectors, each port including a plurality of optio-electrically conductive elements, the first, and second, third and fourth ports being coupled to the circuit board; the first and third ports port configured for providing a connection to a television, the first and third ports being located in the utility box; the first port being located on the utility box; the second port and fourth ports configured for providing a connection to an external source of signal for the television, the second and fourth ports port being located on the panel; and a power port disposed within a third fifth opening defined by the housing within the utility box, the power port for receiving electrical power at the circuit board.

5. The media appliance as recited in claim 4, wherein the optio-electric connectors are selected from the group consisting of RJ45, serial, IR Input, service/control, USB, video, ethernet, L/R audio cable, and digital audio optical.

6. A media appliance comprising:
a housing adapted to be mounted within a wall, the housing including a utility box and a panel configured to mount thereto;
the panel forming a front portion of the housing, the panel including vents, the panel configured to substantially mount flush with the wall;
mounting holes configured to secure the panel to the utility box;
mounting brackets for securing the utility box to the wall;
a circuit board secured within the housing, the circuit board including a processor and a memory accessible to the processor, the memory including processor-executable instructions that, when executed, cause the processor to execute set-top box functionality and cause the processor to execute media player functionality;
first and second ports, disposed within respective first and second openings defined by the housing, for receiving respective optio-electric connectors, each port including a plurality of optio-electrically conductive elements, the first and second ports being coupled to the circuit board;
the first port configured for providing a connection to a television, the first port being located on the utility box;

the second port configured for providing a connection to an external source of signal for the television, the second port being located on the panel;

third and fourth ports, disposed within respective third and fourth openings defined by the housing, for receiving respective optio-electric connectors, each port including a plurality of optio-electrically conductive elements, the third and fourth ports being coupled to the circuit board;

the third port configured for providing a connection to an external audio-visual device, the third port being located on the utility box;

the fourth port configured for providing a connection to an external source of signal for the external audio-visual device, the fourth port being located on the panel;

a fifth port, disposed within respective first and second openings defined by the housing, for receiving an optio-electric connector, the fifth port including a plurality of optio-electrically conductive elements, the fifth port being coupled to the circuit board;

the fifth port configured for providing a connection to a device selected from the group consisting of the television and the external audio-visual device, the fifth port being located on the panel; and a power port disposed within a third opening defined by the housing within the utility box, the power port for receiving electrical power at the circuit board.

7. The media appliance as recited in claim 6, wherein the optio-electric connectors are selected from the group consisting of RJ45, serial, IR Input, service/control, USB, video, ethernet, L/R audio cable, and digital audio optical.

\* \* \* \* \*